United States Patent [19]

Takabatake et al.

[11] Patent Number: 4,593,006

[45] Date of Patent: Jun. 3, 1986

[54] COMPOSITION FOR MULTILAYER PRINTED WIRING BOARD

[75] Inventors: Mitsuo Takabatake; Jiro Chiba, both of Yokohama; Yoshinori Kokubu, Tokyo, all of Japan

[73] Assignee: Asahi Glass Company, Ltd., Tokyo, Japan

[21] Appl. No.: 722,211

[22] Filed: Apr. 11, 1985

[51] Int. Cl.$^4$ .................... C03C 14/00; C03C 3/091; C03C 3/064
[52] U.S. Cl. .................................. 501/32; 501/66; 501/77
[58] Field of Search ............... 501/32, 17, 21, 66, 501/77

[56] References Cited

U.S. PATENT DOCUMENTS

| 4,039,338 | 8/1977 | Swiss et al. | 501/153 |
| 4,153,491 | 8/1979 | Swiss et al. | 264/63 |
| 4,547,625 | 10/1985 | Tosaku et al. | 501/61 |

Primary Examiner—Mark L. Bell
Attorney, Agent, or Firm—Oblon, Fisher, Spivak, McClelland & Maier

[57] ABSTRACT

A composition for a multilayer printed wiring board, consisting essentially of from 25 to 65% by weight of glass powder, from 0 to 60% by weight of alumina powder and from 5 to 60% by weight of forsterite powder, said glass powder consisting essentially of from 25 to 70% by weight of $SiO_2$, from 4 to 15% by weight of $Al_2O_3$, from 25 to 45% by weight of $B_2O_3$ and from 0.5 to 30% by weight of BaO.

5 Claims, No Drawings

COMPOSITION FOR MULTILAYER PRINTED WIRING BOARD

BACKGROUND OF THE INVENTION

1. Field of the Invention

The present invention relates to a composition for a multilayer printed wiring board. More particularly, it relates to a composition which can be sintered at a low temperature.

2. Description of the Prior Art

Electronic parts have been proposed wherein circuits and insulating layers are alternatively laminated on a insulating board to form three dimensional circuits. As such electronic parts, there are a first type which can be prepared by printing circuits and insulating layers alternatively on a board such as an alumina board previously formed by sintering, and then sintering the printed board, and a second type which can be prepared by printing circuits on non-sintered ceramic boards, and laminating the printed boards so that the circuits do not contact one another, followed by pressing and sintering.

In the first type, each insulating layer formed on a printed circuit becomes uneven due to the presence of the circuit therebeneath, and the unevenness increases towards upper layers. As the unevenness of the layer increases, it becomes difficult to print the next circuit thereon. This constitutes one of the factors which limit the number of laminated layers. Normally, in the first type, from 5 to 6 layers are regarded to be the maximum number.

Whereas, in the second type, the printing of a circuit is effected always to a substantially flat board, whereby there is no such limitation as in the case of the first type, and it is possible to prepare a product having a great number of laminated layers. Thus, it is possible to attain correspondingly high density integration.

As a material for the board of the second type, a composition comprising from 8 to 16% by weight of alumina powder and glass powder is disclosed in U.S Pat. Nos. 4,039,338 and 4,153,491.

However, such a conventional composition has an extremely high sintering temperature at a level of from 1500° to 1600° C. Therefore, there have been difficulties such that it is required to use an expensive material such as W or Mo which is durable at such a high sintering temperature, as the material for the circuit, and it is required to conduct the sintering in a reducing atmosphere.

SUMMARY OF THE INVENTION

It is a primary object of the present invention to provide a composition which can be sintered at a temperature not higher than 1000° C. and which provides a sintered board having excellent corrosion resistance to water and being free from deteriorating the circuit even when used for a long period of time.

The present inventors have found that the above object can be attained by a composition prepared by incorporating from 5 to 60% by weight of forsterite powder as a refractory filler to a specific glass powder of $SiO_2$—$Al_2O_3$—$B_2O_3$—$BaO$ type.

Namely, the composition of the present invention consists essentially of from 25 to 65% by weight of glass powder, from 0 to 60% by weight of alumina powder and from 5 to 60% by weight of forsterite powder. The glass powder consists essentially of from 25 to 70% by weight of $SiO_2$, from 4 to 15% by weight of $Al_2O_3$, from 25 to 45% by weight of $B_2O_3$ and from 0.5 to 30% by weight of BaO.

DETAILED DESCRIPTION OF THE INVENTION

The specific ranges of the respective components of the composition of the present invention have the following significance.

If the glass powder is less than 25% by weight, the sintering temperature tends to be high, whereby it becomes difficult to conduct the sintering at a low temperature as intended by the present invention. On the other hand, if the glass powder exceeds 60% by weight, the flexural strength and corrosion resistance to water of the sintered product tends to be poor. The glass powder is preferably within a range of from 30 to 50% by weight within the above specified range.

The alumina powder i.e. $Al_2O_3$ powder, is not an essential component. However, with an addition of the alumina powder, the thermal conductivity of the sintered product increases, and when formed into a multilayer printed wiring board, the heat dissipation will be excellent, and the dielectric loss tangent will be small. Accordingly, the addition is particularly desirable for a printed wiring board for high frequency. However, if the alumina powder is added in an amount exceeding 60% by weight, the sintering temperature tends to be too high. The amount of the addition is preferably from 10 to 55% by weight within the above specified range.

If the forsterite powder ($2MgO.SiO_2$) is less than 5% by weight, the sintered product tends to be brittle and will have poor corrosion resistance to water. On the other hand, if the amount exceeds 60% by weight, the sintering temperature tends to be too high. The forsterite powder is preferably within a range of from 5 to 50% by weight within the above specified range.

As the forsterite powder, there may be used a commercially available product, i.e. a solid solution comprising $Mg_2SiO_4$ as the main component and a very small amount of $Fe_2SiO_4$. It is of course possible to use a powder composed solely of $Mg_2SiO_4$.

The particle sizes of the above powders are not critical. However, the following sizes are preferred.

Namely, the glass, forsterite and alumina powders preferably have an average particle size of from 0.5 to 5 $\mu$m and the maximum particle size of at most 20 $\mu$m. If the particle sizes are too small, cracks are likely to form during the drying operation of a green sheet. On the other hand, if the average particle size or maximum particle size is too great, the forsterite powder can not adequately be wetted with the glass powder during the sintering operation, whereby the strength of the product tends to decrease.

As the glass powder for the present invention, a powder having the following composition is preferred in that it has a low dielectric constant and is capable of forming, together with the forsterite powder and the alumina powder, a sintered product having excellent flexural strength and corrosion resistance to water.

$SiO_2$: 25–70% by weight;
$Al_2O_3$: 4–15% by weight;
$B_2O_3$: 25–45% by weight;
BaO: 0.5–30% by weight.

The specific ranges of the respective components have the following significance.

If $SiO_2$ is less than 25% by weight, the dielectric constant of the sintered product tends to be too great.

On the other hand, if $SiO_2$ exceeds 70% by weight, the sintering temperature tends to be too high. The amount of $SiO_2$ is preferably within a range of from 35 to 50% by weight.

If $Al_2O_3$ is less than 4% by weight, the corrosion resistance to water of the sintered product tends to be poor. On the other hand, if $Al_2O_3$ exceeds 15% by weight, devitrification is likely to occur during the preparation of the glass powder. The amount of $Al_2O_3$ is preferably within a range of from 5 to 13% by weight.

$B_2O_3$ is a flux. If the amount is less than 25% by weight, the sintering temperature tends to be too high, and if the amount exceeds 45% by weight, the chemical stability of the glass tends to be poor. The amount is preferably within a range of from 30 to 40% by weight.

BaO has a function to improve the melting property for the preparation of the glass powder. If the amount is less than 0.5% by weight, no adequate effect will be obtained, and if the amount exceeds 30% by weight, the dielectric constant of the sintered product tends to be too great. The amount is preferably within a range of from 5 to 25% by weight.

Further, the following additional components may be added to the glass powder to improve the melting property of the glass material for the preparation of the glass powder.

$Na_2O + K_2O + Li_2O < 1$% by weight
$ZnO + CaO + MgO + SrO < 5$% by weight

If the additional components exceed the above ranges, the dielectric constant increases, whereby the transmission loss of high frequency increases, such being undesirable.

The glass powder may be prepared, for instance, in the following manner.

Starting materials for the respective components, such as silica, alumina powder, boric acid and barium carbonate, are blended and mixed to obtain a batch having a desired composition. Then, this batch is placed in a platinum crucible, and heated in an electric furnace at a temperature of from 1400° to 1500° C. for 1 to 2 hours for vitrification. Then, the molten glass is poured into water for crushing, or it is formed into a sheet and then crushed in a ball mill, to obtain a glass powder.

The mixing of the fillers (i.e. the forsterite and alumina powders) and the glass powder may be conducted by adding predetermined amounts of the fillers at the time of the pulverization of the glass, so that the pulverization and mixing can be simultaneously carried out. Otherwise, the fillers and the glass powder may be pulverized to predetermined particle sizes, respectively, and then mixed.

The composition of the present invention is composed of the above-mentioned powders in the specified proportions. By using such a composition, a multilayer printed wiring board may be prepared, for instance, in the following manner.

To the composition of the present invention, an organic binder, a plasticizer and a solvent are added and kneaded to form a paste. As the organic binder, plasticizer and solvent, there may be employed those which are commonly used. For instance, as the organic binder, polyvinyl butyral may be used. As the plasticizer, there may be employed dioctyl phthalate or polyethylene glycol. As the solvent, there may be employed toluene or an alcohol.

Then, the paste is molded into a sheet, and further dried at a temperature of from 60° to 80° C. to obtain a green sheet. Then, a predetermined circuit is printed on one side of this green sheet by a thick-film forming method. Such printed green sheets are then laminated, and pressed to form a unitary laminate. The laminate is then subjected to sintering, whereby the green sheets and circuits are sintered to each other. The product thereby obtained is a laminate wherein circuits are laminated in a plurality of layers with insulating sheets interposed inbetween.

Now, the present invention will be described in further detail with reference to Examples. However, it should be understood that the present invention is by no means restricted to these specific Examples.

EXAMPLES

Glasses of Examples 1 to 20 having compositions as identified in the upper part of Table 1 have been prepared and pulverized as mentioned above to obtain glass powders having an average particle size of 2 $\mu$m and the maximum particle size of 20 $\mu$m. Then, they were mixed with fillers of the types and amounts as identified in the lower part of the same Table to obtain test sample compositions. In each sample, the content of the glass powder is the rest of the amounts of fillers. Further, the particles sizes of the fillers were substantially the same as the particle size of the glass powder. Examples 17 to 20 represent Comparative Examples.

Then, to each test sample composition, polyvinyl butyral as an organic binder, dioctyl phthalate and polyethylene glycol as plasticizers and toluene and alcohol as solvents, were added, and the mixture was kneaded to obtain a paste having a viscosity of from 10000 to 30000 cps. Then, this paste was formed into a sheet having a thickness of about 0.5 mm, and then dried at a temperature of from 60° to 80° C. for about 2 hours. Then, this sheet was heated at a rate of 300° C./hr, and finally sintered for 1 hour at the heating temperature as specified in Table 2 to obtain a sintered sheet. With respect to this sintered sheet, the dielectric constant, the dielectric loss tangent, the thermal expansion coefficient, the corrosin resistance to water and the flexural strength were measured. The results are shown in Table 2. In the Table, symbol mark O for the corrosion resistance to water designates a sintered sheet which showed a weight reduction of less than 1% when immersed in a hot water of 100° C. for 2 hours, and the symbol mark X designates a sintered sheet which showed such a weight reduction of at least 1%.

In Examples 18 and 19, when the respective green sheets were sintered, they disintegrated into powders, whereby no sintered sheets were obtained. Accordingly, their physical properties were not measured.

The flexural strength was measured in the following manner.

The sintered sheet was cut into a size of 10 mm in width (w) and 50 mm in length. This sample was placed on two supports disposed with a distance L of 40 mm, and a load was exerted at the center portion between the two supports at a rate of 0.5 mm/min, whereby the load p upon the breakage of the sample was obtained.

From the above values, the flexural strength $\sigma$ was obtained according to the following equation.

$$\sigma = \frac{3pL}{2wt^2}$$

where $\sigma$ is the flexural strength, p is the load, L is the distance between the supports, w is the width of the test sample, and t is the thickness of the test sample.

The flexural strength shown in the Table is an average value obtained from ten samples.

It is evident from the Table that the compositions of the present invention can be sintered at a low temperature of not higher than 1000° C., and the sintered products have excellent corrosion resistance to water. Further, their dielectric constants, dielectric loss tangent and thermal expansion coefficients are adequately satisfactory for use for multilayer printed wiring boards.

2. The composition according to claim 1, which consists essentially of from 25 to 65% by weight of the glass powder, from 10 to 55% by weight of the alumina powder, and from 5 to 50% by weight of the forsterite powder.

3. The composition according to claim 2, wherein said glass powder consists essentially of from 30 to 50% by weight of $SiO_2$, from 5 to 13% by weight of $Al_2O_3$, from 30 to 40% by weight of $B_2O_3$ and from 5 to 25% by weight of BaO.

4. The composition according to claim 1, which consists essentially of from 30 to 50% by weight of the glass

TABLE 1

(Composition Examples)

| Example No. | 1 | 2 | 3 | 4 | 5 | 6 | 7 | 8 | 9 | 10 | 11 | 12 | 13 | 14 | 15 | 16 | 17* | 18* | 19* | 20* |
|---|---|---|---|---|---|---|---|---|---|---|---|---|---|---|---|---|---|---|---|---|
| Composition of glass (wt. %) | | | | | | | | | | | | | | | | | | | | |
| $SiO_2$ | 45 | 45 | 45 | 45 | 45 | 45 | 45 | 45 | 45 | 35 | 30 | 50 | 55 | 50 | 30 | 30 | 45 | 45 | 45 | 30 |
| $Al_2O_3$ | 10 | 10 | 10 | 10 | 10 | 10 | 10 | 10 | 10 | 13 | 5 | 13 | 7 | 10 | 5 | 10 | 10 | 10 | 10 | 10 |
| $B_2O_3$ | 35 | 35 | 35 | 35 | 35 | 35 | 35 | 35 | 35 | 40 | 40 | 30 | 33 | 30 | 35 | 40 | 35 | 35 | 35 | 20 |
| BaO | 10 | 10 | 10 | 10 | 10 | 10 | 10 | 10 | 10 | 12 | 25 | 7 | 5 | 5 | 25 | 15 | 10 | 10 | 10 | 25 |
| $Na_2O$ | | | | | | | | | | | | | | 0.5 | | 0.7 | | | | |
| $K_2O$ | | | | | | | | | | | | | | 0.1 | | 0.1 | | | | |
| $Li_2O$ | | | | | | | | | | | | | | 0.1 | | 0.2 | | | | |
| ZnO | | | | | | | | | | | | | | 3 | | | | | | |
| CaO | | | | | | | | | | | | | | 1.3 | | 4 | | | | 10 |
| MgO | | | | | | | | | | | | | | | 4 | | | | | |
| SrO | | | | | | | | | | | | | | | 1 | | | | | |
| Contents of fillers (wt. %) | | | | | | | | | | | | | | | | | | | | |
| Forsterite | 10 | 5 | 30 | 10 | 30 | 40 | 50 | 50 | 55 | 20 | 10 | 5 | 50 | 30 | 30 | 40 | 0 | 10 | 65 | 60 |
| Alumina | 50 | 50 | 30 | 30 | 40 | 15 | 10 | 0 | 0 | 40 | 30 | 40 | 10 | 30 | 20 | 20 | 50 | 65 | 10 | — |

*Comparative Examples

TABLE 2

(Heating conditions and test results)

| Example No. | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Heating temp. (°C.) | 900 | 910 | 850 | 850 | 950 | 870 | 930 | 950 | 980 | 900 | 900 | 980 | 950 | 900 |
| Heating period (min.) | 60 | 60 | 60 | 60 | 60 | 60 | 60 | 60 | 60 | 60 | 60 | 60 | 60 | 60 |
| Coefficient of thermal expansion ($\times 10^{-7}$ °C.$^{-1}$) | 43 | 45 | 52 | 38 | 55 | 58 | 62 | 65 | 68 | 48 | 50 | 45 | 50 | 53 |
| Dielectric constant | | | | | | | | | | | | | | |
| Frequency: 1 KHz | 6.5 | 6.5 | 6.3 | 5.8 | 6.4 | 6.1 | 5.9 | 5.4 | 5.6 | 6.0 | 6.5 | 5.7 | 5.7 | 5.9 |
| Frequency: 100 KHz | 6.5 | 6.5 | 6.2 | 5.6 | 6.4 | 6.1 | 5.8 | 5.0 | 5.5 | 5.8 | 6.3 | 5.5 | 5.5 | 5.8 |
| Dielectric loss | | | | | | | | | | | | | | |
| Frequency: 1 KHz | $8 \times 10^{-4}$ | 8 | 10 | 10 | 7 | 10 | 15 | $15 \times 10^{-4}$ | 20 | 10 | 15 | 7 | 8 | 8 |
| Corrosion resistance to water | 0 | 0 | 0 | 0 | 0 | 0 | 0 | 0 | 0 | 0 | 0 | 0 | 0 | 0 |
| Flexural strength (kg/mm$^2$) | 25 | 22 | 20 | 18 | 22 | 20 | 18 | 20 | 22 | 22 | 20 | 25 | 22 | 20 |

| | 15 | 16 | 17* | 18* | 19* | 20* |
|---|---|---|---|---|---|---|
| Heating temp. (°C.) | 900 | 900 | 900 | — | — | 950 |
| Heating period (min.) | 60 | 60 | 60 | — | — | 65 |
| Coefficient of thermal expansion ($\times 10^{-7}$ °C.$^{-1}$) | 55 | 53 | 68 | — | — | 55 |
| Dielectric constant | | | | | | |
| Frequency: 1 KHz | 6.3 | 6.2 | 6.2 | — | — | 6.5 |
| Frequency: 100 KHz | 6.1 | 6.1 | 6.2 | — | — | 6.3 |
| Dielectric loss | | | | | | |
| Frequency: 1 KHz | $10 \times 10^{-4}$ | 10 | 20 | — | — | 5 |
| Corrosion resistance to water | | | x | — | — | x |
| Flexural strength (kg/mm$^2$) | 20 | 18 | 10 | — | — | 10 |

*Comparative Examples

What is claimed is:

1. A composition for a multilayer printed wiring board, consisting essentially of from 25 to 65% by weight of glass powder, from 0 to 60% by weight of alumina powder and from 5 to 60% by weight of forsterite powder, said glass powder consisting essentially of from 25 to 70% by weight of $SiO_2$, from 4 to 15% by weight of $Al_2O_3$, from 25 to 45% by weight of $B_2O_3$ and from 0.5 to 30% by weight of BaO.

powder, from 10 to 55% by weight of the alumina powder and from 5 to 55% by weight of the forsterite powder.

5. The composition according to claim 4, wherein said glass powder consists essentially of from 30 to 50% by weight of $SiO_2$, from 5 to 13% by weight of $Al_2O_3$, from 30 to 40% by weight of $B_2O_3$ and from 5 to 25% by weight of BaO.

* * * * *